(12) United States Patent
Kim

(10) Patent No.: US 8,702,142 B2
(45) Date of Patent: Apr. 22, 2014

(54) APPARATUS AND METHOD FOR HANDLING A SUBSTRATE

(75) Inventor: Kyung Young Kim, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 13/343,506

(22) Filed: Jan. 4, 2012

(65) Prior Publication Data

US 2012/0169079 A1    Jul. 5, 2012

Related U.S. Application Data

(60) Provisional application No. 61/430,029, filed on Jan. 5, 2011.

(51) Int. Cl.
*B66F 19/00* (2006.01)

(52) U.S. Cl.
USPC .................. 294/213; 294/103.1; 414/941

(58) Field of Classification Search
USPC ........ 294/103.1, 197, 116, 203, 213; 414/941
See application file for complete search history.

(56) References Cited

U.S. PATENT DOCUMENTS

| | | | |
|---|---|---|---|
| 5,230,599 A * | 7/1993 | Orr ............................ | 294/103.1 |
| 6,092,971 A * | 7/2000 | Balg et al. ................. | 414/416.03 |
| 6,109,677 A | 8/2000 | Anthony | |
| 6,167,322 A * | 12/2000 | Holbrooks .................... | 700/112 |
| 6,540,468 B1 * | 4/2003 | Blattner et al. .......... | 414/416.08 |
| 7,140,655 B2 | 11/2006 | Kesil et al. | |
| 7,300,082 B2 | 11/2007 | Rogers et al. | |
| 7,434,856 B2 * | 10/2008 | Gerhard et al. ................ | 294/188 |
| 7,980,611 B2 | 7/2011 | Zenpo et al. | |
| 2003/0151268 A1 * | 8/2003 | Holbrooks .................. | 294/103.1 |
| 2004/0102858 A1 | 5/2004 | Kesil et al. | |
| 2005/0017529 A1 | 1/2005 | Rogers et al. | |
| 2006/0157998 A1 | 7/2006 | Gershenzon et al. | |
| 2006/0267361 A1 * | 11/2006 | Delbridge .................. | 294/103.1 |
| 2007/0018469 A1 | 1/2007 | Gershenzon et al. | |
| 2008/0213076 A1 | 9/2008 | Hanson et al. | |
| 2009/0232631 A1 | 9/2009 | Zenpo et al. | |
| 2010/0193567 A1 | 8/2010 | Scheib et al. | |

FOREIGN PATENT DOCUMENTS

| JP | 07-022502 A | 1/1995 |
|---|---|---|
| JP | 2002-170862 A | 6/2002 |

OTHER PUBLICATIONS

International Search Report and Written Opinion of PCT/US2012/020293, 4 pages.

* cited by examiner

*Primary Examiner* — Saul Rodriguez
*Assistant Examiner* — Gabriela Puig

(57) ABSTRACT

A grip mechanism for an end effector includes a grip member configured to be coupled to an effector body. A gripper of the grip member is movable based on movement of the grip member such that the gripper is movable along an engagement path to an engagement position where an object such as a substrate can be retained within a retaining region adjacent to the effector body. End effectors for handling objects incorporating one or more grip mechanisms, and methods of handling an object such as a substrate, are also disclosed.

23 Claims, 5 Drawing Sheets

APPARATUS AND METHOD FOR HANDLING A SUBSTRATE

CROSS REFERENCE TO RELATED APPLICATIONS

This application claims the benefit of U.S. Provisional Application No. 61/430,029, filed Jan. 5, 2011, the contents of which are incorporated herein by reference.

BACKGROUND

Embodiments of the present invention as exemplarily described herein relate generally to apparatuses and methods for handling substrates. More particularly, embodiments of the present invention relate to end effector gripping mechanisms capable of handling tape-framed substrates.

Tape frame assemblies such as tape frame assembly can be used to support a substrate during substrate dicing processes, die-bonding process, and during shipping and storage of the substrate. Typically, a tape frame assembly includes a frame and support film stretched across the frame. A substrate (e.g., a semiconductor wafer) can be mounted onto the support film and held in place by an adhesive material. Thereafter, the substrate can be processed while being mounted on the support film. To improve throughput and reduce the cost of devices formed on substrates, the substrates have generally increased in size. As substrates grow larger, the size and weight of frames capable of supporting such substrates typically increases as well. For example, a tape frame assembly capable of supporting a 300 mm Si wafer can weight up to at least 500 grams. Unfortunately, the increased size and weight of tape frame assemblies can create problems when attempting to hold, release, move, or otherwise handle the tape frame assemblies using conventional end-effector technology.

SUMMARY

In one embodiment, a grip mechanism for an end effector can include a grip member configured to be coupled to an effector body. The grip member can include a gripper and be movable in a first direction away from a first end of the effector body toward a second end of the effector body. A first portion of the grip member can be moveable relative to the effector body along a first travel path based on movement of the grip member in the first direction. The grip mechanism can also include a grip guide operatively coupled to the grip member. The grip guide can be configured to guide a movement of a second portion of the grip member along a second travel path based on movement of the grip member in the first direction. Further, the grip member and grip guide can be configured such that the gripper is movable to a first engagement position along a first engagement path based upon movement of the first and second portions along the first and second travel paths. The first engagement path can extend away from a proximal side of the effector body and toward a retaining region adjacent to the effector body. At the first engagement position, the gripper can be configured to engage an object disposed within the retaining region.

In another embodiment, an end effector operative to handle a substrate disposed within a retaining region adjacent thereto can include an effector body and the grip mechanism exemplarily described above. Accordingly, a substrate can be retainable within the retaining region when the gripper is at the first engagement position.

In another embodiment, an end effector operative to handle a substrate disposed within a retaining region adjacent thereto can include an effector body and a grip member coupled to the effector body and movable along a first axis. The end effector can further include a grip guide configured to rotate the grip member about a second axis to a first engagement position based on movement of the grip member along the first axis. The second axis can be arranged at an angle of greater than 0 degrees and less than 180 degrees relative to the first axis. The grip member and grip guide can be configured such that the gripper is movable to the first engagement position along the first engagement path based upon movement of the grip member such that a substrate is retainable within the retaining region.

In another embodiment, a method of handling a substrate can include arranging an end effector over a substrate. Moving a grip member of the end effector in a first direction away from a first end of an end effector body and toward a second end of the end effector body. In this embodiment, moving the grip member can include moving the gripper to the first engagement position along the first engagement path such that the substrate can be retained within the retaining region when the gripper is at the first engagement position.

DETAILED DESCRIPTION OF THE ILLUSTRATED EMBODIMENTS

Figure 1:
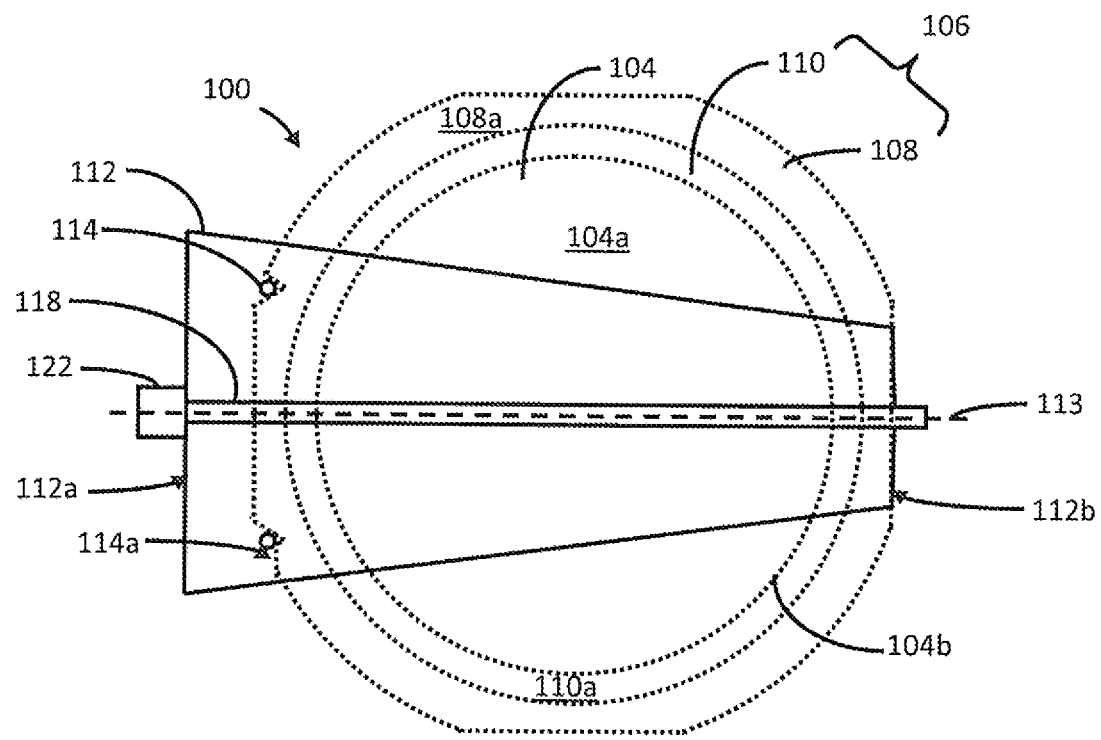
FIGS. 1 and 2 are top and side plan views, respectively, schematically illustrating an end effector having a grip mechanism according to one embodiment.

The invention is described more fully hereinafter with reference to the accompanying drawings, in which example embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that, although the terms first, second, third, etc., may be used herein to describe various elements, components, regions, sets, ends, paths, etc., these elements, components, regions, sets, should not be limited by these terms. These terms are only used to distinguish one element, component, region, set, end, path, etc., from another element, component, region, set, end, path, etc. Thus, a first element, component, region, set, end, path, etc., discussed below could be termed a second element, component, region, set, end, path, etc., without departing from the teachings provided herein.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, ends, paths, and/or groups thereof.

Figure 2:
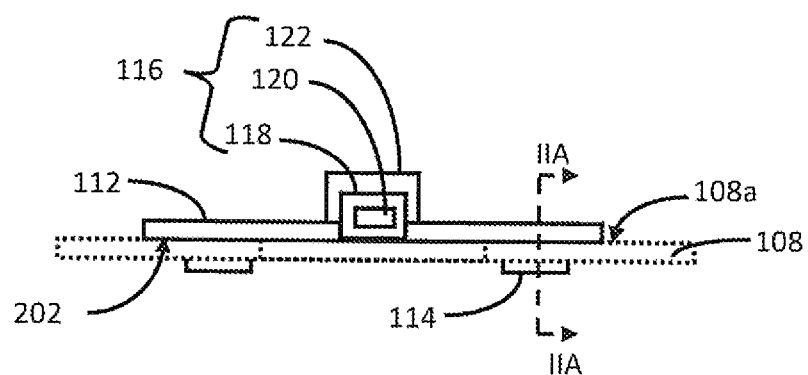
Figure 2A:
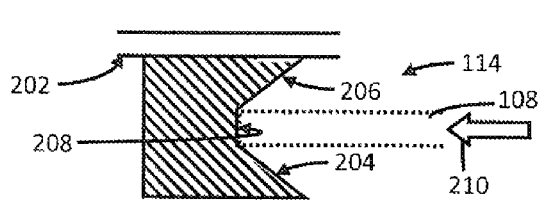
FIGS. 2A and 2B are cross-section views of a guide post, taken along line IIA-IIA shown in FIG. 2, according to some embodiments.
Figure 2B:
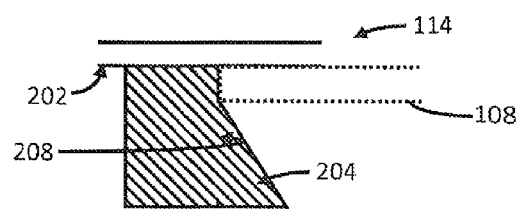

FIGS. 1 and 2 are top and side plan views, respectively, schematically illustrating an end effector having a grip mechanism according to one embodiment. FIGS. 2A and 2B are cross-section views of a guide post, taken along line IIA-IIA shown in FIG. 2, according to some embodiments.

Referring to FIGS. 1 and 2, an end effector, such as end effector 100, can be configured to handle (e.g., hold, release, move, etc.) a substrate 104 that is disposed within a retaining region adjacent thereto. Although the description provided herein discusses handling of the substrate 104 by the end effector 100 indirectly via a tape frame assembly 106, it will be appreciated that the end effector 100 can also be configured to directly handle the substrate 104 (e.g., in a state in which the substrate 104 is not supported by the tape frame assembly).

In the illustrated embodiment, the substrate 104 is a semiconductor substrate (e.g., a silicon substrate) or wafer having a diameter of 125 mm substrate, 150 mm, 200 mm, 300 mm, 450 mm, or the like. In other embodiments, however, the substrate 104 may be any relatively thin, flat and wide object (e.g., a glass substrate as found in liquid crystal display (LCD) panels). In the illustrated embodiment, the substrate 104 is retained on a tape frame assembly 106 including, for example, a frame 108 and a support film 110 spanning the frame 108 and supporting the substrate 104. Generally, an upper surface 104a of the substrate 104 is elevationally between an upper surface 108a of the frame 108 and an upper surface 110a of the support film 110. Tape frame assemblies such as tape frame assembly 106 are known in the art and can be used to support the substrate 104 during substrate dicing processes, die-bonding process, and during shipping and storage of the substrate 104. The end effector 100 may include an effector body 112, one or more guide posts 114, and a grip mechanism 116.

The effector body 112 extends along the upper surface 104a of the substrate 104 and includes a first end 112a (also referred to herein as a "proximal" end) and a second end 112b ((also referred to herein as a "distal" end) spaced apart from the proximal end 112a along a longitudinal axis 113 (also referred to herein as an "effector body axis") of the effector body 112. The effector body 112 is typically provided as a cantilevered body in which the proximal end 112a is supported by a robot (not shown) and the distal end 112b is unsupported. In the illustrated embodiment, the effector body 112 extends over the upper surface 104a of the substrate 104.

Each guide post 114 can be configured to engage a portion of the frame 108 (e.g., an alignment notch 114a of the frame 108) to help ensure that the tape frame assembly 106 is properly aligned relative to the end effector 100 during handling of the substrate 104. As best shown in FIGS. 2 and 2A, each guide post 114 extends downwards, away from a lower side 202 (also referred to herein as a "proximal side") of the effector body 112, which faces towards the substrate 104 and frame 108 of the tape frame assembly 106. As shown in FIG. 2A, the surface of each guide post 114 can include a first guide surface 204, a second guide surface 206 and a third guide surface 208. Generally, the first and second guide surfaces 204 and 206 are configured to deflect movement of the frame 108 toward the third guide surface 208. It will be appreciated that the first, second and third guide surfaces 204, 206 and 208 may be configured in any suitable manner. Moreover, the second guide surface 206 may be omitted and the third guide surface 208 may extend from the first guide surface 204 toward the lower side 202 of the effector body 112 (as exemplarily shown in FIG. 2B) or completely to the lower side 202 of the effector body 112. Constructed as described above, the guide post 114 can be used to ensure that the tape frame assembly 106 is both horizontally and vertically aligned relative to the end effector 100 during handling of the substrate 104.

The grip mechanism 116 can include a grip support 118, a grip member 120 coupled to the grip support 118, and a grip actuator 122 (e.g., an electrical motor, a pneumatic actuator, a hydraulic actuator, a linear actuator, a piezoelectric actuator, an electroactive polymer, or the like or a combination thereof) configured to actuate the grip member 120. As exemplarily illustrated, the grip support 118 extends along, and is aligned with, the effector body axis 113. In other embodiments, however, the grip support 118 may extend along a direction different from the effector body axis 113. Although the grip support 118 is illustrated as extending along, and being aligned with, the diameter or maximum width of the substrate 104 and frame 108, it will be appreciated that the grip support 118 may extend along a direction different from the diameter or maximum width of the substrate 104 and/or the frame 108.

When actuated by the grip actuator 122, the grip member 120 can be selectively moved into one or more positions such as an engagement position and a disengagement position. When moved into an engagement position, the grip member 120 can engage (e.g., physically contact) an edge or other peripheral region of the frame 108 disposed within a retaining region (not shown) adjacent to the end effector 100. When the grip member 120 engages the frame 108, the frame 108 can be moved along the direction indicated by arrow 210 as exemplarily shown in FIG. 2A to be held against the grip supports 114. When the frame 108 is thus engaged by the grip member 120, the frame assembly 106 (and, thus, the substrate 104) can be handled by the end effector 100. When moved into a disengagement position, the grip member 120 can disengage (e.g., become physically spaced apart from) the frame 108 so that the tape frame assembly 106 and substrate 104 removed from the end effector 100. Constructed as exemplarily described above, the end effector 100 can be characterized as a type of "top grip" end effector.

Figure 3:
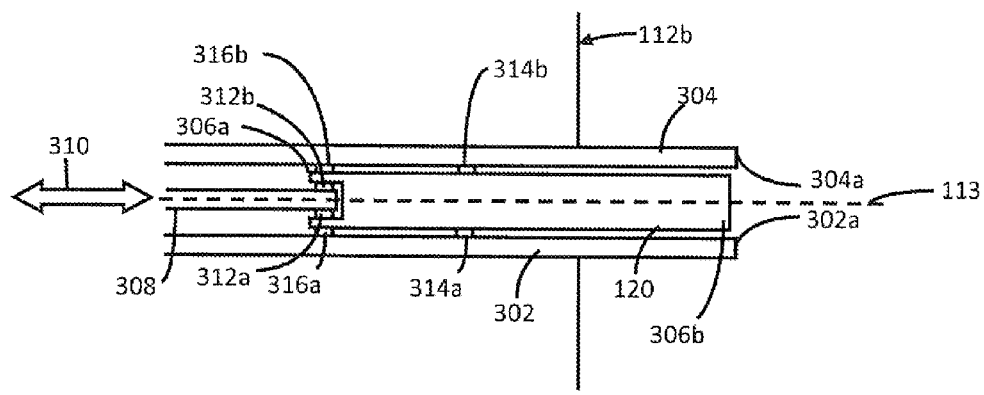
FIG. 3 is a top plan view schematically illustrating a portion of the grip mechanism shown in FIG. 1, according to one embodiment.

FIG. 3 is a top plan view schematically illustrating a portion of the grip mechanism shown in FIG. 1, according to one embodiment.

Referring to FIG. 3, the grip support 118 includes a first support rail 302 and a second support rail 304 spaced apart from the first rail 302. The first support rail 302 and second support rail 304 may be coupled to the effector body 112 and have ends 302a and 304a, respectively, that protrude beyond the distal end 112b of the effector body 112. In another embodiment, however, one or both of the ends 302a and 304a of the first support rail 302 and second support rail 304 may not protrude from the distal end 112b of the effector body 112. For example, one or both of the ends 302a and 304a of the first support rail 302 and second support rail 304 may be coplanar (or at least substantially coplanar) with the distal end 112b of the effector body 112. Although the grip support 118 is illustrated as including the first support rail 302 and the second support rail 304, it will be appreciated that one of the first support rail 302 and the second support rail 304 may be omitted. In one embodiment, the first support rail 302 and the second support rail 304 may each be provided as pieces which are separate from, but coupled to, the effector body 112. In another embodiment, one or both of the first support rail 302 and the second support rail 304 may be integrally formed with the effector body 112.

Generally, the grip member 120 has first end 306a and a second end 306b opposite the first end 306a. In the illustrated embodiment, the grip member 120 is provided as a single, substantially rigid body in which the first end 306a is immovable relative to the second end 306b. In other embodiments, however, the grip member 120 may be provided as a flexible body or by a plurality of rigid bodies that are pivotally coupled to one another. Although the second end 306b of the grip member 120 is illustrated as protruding a distance beyond the distal end 112b of the effector body 112 that is less than a distance to which the ends 302a and 304a of the first support rail 302 and the second support rail 304 respectively protrude, it will be appreciated that the second end 306b of the grip member 120 can protrude a distance beyond the distal end 112b of the effector body 112 that is equal to or greater than the distance to which the ends 302a and 304a of the first support rail 302 and the second support rail 304 respectively protrude.

Generally, the grip member 120 is movable relative to the grip support 118 along directions indicated by arrow 310 which, as exemplarily illustrated, extend along the effector body axis 113. The grip member 120 may also be moveable relative to the effector body 112 and the guide posts 114. In the illustrated embodiment, a linkage arm 308 may be provided to couple the grip member 120 to the grip actuator 122. For example, the linkage arm 308 can be coupled to the grip member 120 at the first end 306a. Accordingly, grip actuator 122 can actuate the grip member 120 by moving the linkage arm 308 to the left (i.e., toward the proximal end 112a) or to the right (i.e., toward the distal end 112b) as indicated by arrow 310. Upon moving the linkage arm 308, the grip member 120 can generally be moved to the left or right as well. In one embodiment, the linkage arm 308 is pivotally coupled to the first end 306a by, for example, axially-aligned linkage pins 312a and 312b (also generically referred to herein as linkage pins 312). Accordingly, the grip member 120 and the linkage arm 308 can pivot relative to one another about a common axis of the linkage pins 312. Although linkage pins 312a and 312b are illustrated as separate, it will be appreciated that the linkage pins 312a and 312b may be replaced by a single linkage pin extending through the linkage arm 308.

In the illustrated embodiment, the grip member 120 is movably coupled to the grip support 118 by first pins 314a and 314b (also generically referred to herein as "first pins 314") and second pins 316a and 316b (also generically referred to herein as "second pins 316"). The first pins 314 are each coupled to a first portion of the grip member 120 and the second pins 316 are each coupled to a second portion of the grip member 120. As discussed below in greater detail, the first and second pins 314 and 316 are supported by the grip support 118. Although first pins 314a and 314b are illustrated as separate pins, it will be appreciated that the first pins 314a and 314b may be replaced by a single first pin 314 extending through the grip member 120. Likewise, although second pins 316a and 316b are illustrated as separate pins, it will be appreciated that second pins 316a and 316b may be replaced by a single second pin 316 extending through the grip member 120. Further, although pins 312a and 316a are illustrated as separate, it will be appreciated that pins 312a and 316a may be replaced by a single pin extending through the grip member 120. Likewise, although pins 312b and 316b are illustrated as separate, it will be appreciated that pins 312b and 316b may be replaced by a single pin extending through the grip member 120.

Figure 4:
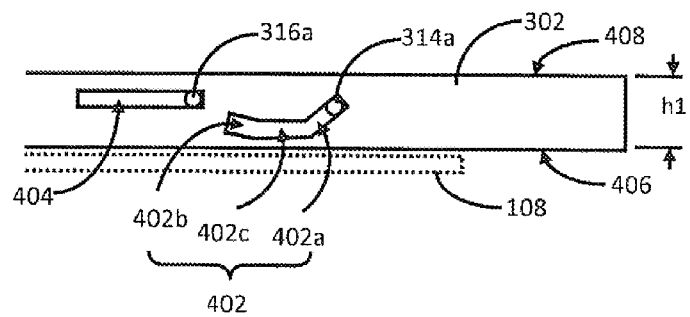
FIG. 4 is a side plan view schematically illustrating the grip mechanism shown in FIG. 3.
Figure 5:
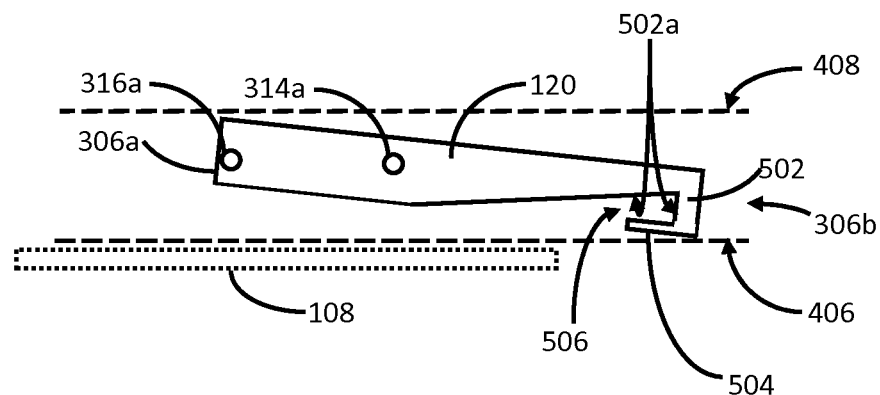
FIG. 5 is a side plan view schematically illustrating the grip member situated within the grip support in the state shown in FIG. 4.

FIG. 4 is a side plan view schematically illustrating the grip mechanism shown in FIG. 3. FIG. 5 is a side plan view schematically illustrating the grip member situated within the grip support in the state shown in FIG. 4.

Referring to FIG. 4, the first support rail 302 of the grip support 118 includes a slot 402 (e.g., a "first slot") and a slot 404 (e.g., a "second slot"). One or both of the first slot 402 and the second slot 404 may extend completely or only partially through the first support rail 302. Generally, however, the first slot 402 is configured to receive the first pin 314a and the second slot 404 is configured to receive the second pin 316a. In one embodiment, the first and second pins 314a and 316a are slideable within the respective ones of the first and second slots 402 and 404. Although the first slot 402 is illustrated as being separate from the second slot 404, it will be appreciated that the first slot 402 may extend continuously to the second slot 404. Although not illustrated, the second support rail 304 can also include a first slot such as the first slot 402 configured to slideably receive the first pin 314b, as well as a second slot such as second slot 404 configured to slideably receive the second pin 316b. When the first and second pins 314a and 316a move within respective ones of the first and second slots 402 and 404, the grip member 120 can move relative to the first support rail 302 and the second support rail 304. Thus, slideable receipt of the first and second pins 314 and 316 within corresponding slots formed in the first and second support rails 302 and 304 enables the grip member 120 to be movably coupled to the grip support 118.

Because each first pin 314 is slideably received within a first slot 402, the shape of each first slot 402 generally defines a path (also referred to herein as a "travel path") along which a first pin 314 received therein (and, thus, the portion of the grip member 120 to which the first pin 314 is attached) can move or slide. Likewise, the shape of each second slot 404 generally defines another travel path along which a second pin 316 received therein (and, thus, the portion of the grip member 120 to which the second pin 316 is attached) can move or slide. Thus, depending on the relative shapes, orientations and positions of the first and second slots 402 and 404, the positions of the first and second pins 314 and 316 relative to the grip member 120, and the positions of the first pins 314 relative to the second pins 316, the grip member 120 can be moved (e.g., translated, rotated, or a combination thereof) relative to the first and second support rails 302 and 304 of the grip support 118. In embodiments where the grip member 120 is rotated relative to the grip support 118, the grip member 120 can be rotated about an axis of rotation that is arranged at an angle of greater than 0 degrees and less than 180 degrees relative to, for example, the effector body axis 113 (e.g., at 90 degrees). In embodiments where the grip member 120 is rotated and translated relative to the grip support 118, the grip member 120 can be rotated as discussed above as when the axis of rotation is, itself, moving (e.g., along the direction indicated by arrow 310). Constructed as described above, the first and second pins 314 and 316 and the first and second slots 402 and 404 can be collectively considered as a "grip guide" configured to guide a movement of different portions of the grip member 120 along different travel paths based on the general movement of the grip member 120 relative to the grip support 118.

As exemplarily illustrated, the first slot 402 can include a first portion 402a, a second portion 402b and a third portion 402c extending continuously from the first portion 402a to the second portion 402b, wherein the first portion 402a, the second portion 402b and the third portion 402c extend along different directions. Although each of the first, second and third portions 402a, 402b and 402c are illustrated as being linear (e.g., so as to define a straight portion of a travel path), at least one of the portions 402a, 402b and 402c may be curved (e.g., so as to define a curved portion of a travel path). Moreover although each of the first, second and third portions 402a, 402b and 402c are illustrated as extending along different directions, it will be appreciated that at least one of the first, second and third portions 402a, 402b and 402c may extend parallel to (i.e., along the same direction as) another of the first, second and third portions 402a, 402b and 402c. Lastly, although the first slot 402 is illustrated as including three portions 402a, 402b and 402c, it will be appreciated that the first slot 402 may include more or fewer portions.

As exemplarily illustrated, the second slot 404 is linear (e.g., so as to define a travel path that is straight). It will nevertheless be appreciated that the second slot 404 can include one or more linear or curved portions as discussed above with respect to the first slot 402. Although the second slot 404 is exemplarily illustrated as extending along the same direction as the third portion 402c of the first slot 402, the second slot 404 can extend along any direction or combination of directions.

Referring now to FIGS. 4 and 5, the first support rail 302 includes a lower side 406 and an upper side 408. In one embodiment, the lower side 406 can be above, below or coplanar with the lower side 202 of the effector body 112. Although not illustrated, the second support rail 304 can also include a lower surface such as lower surface 406 and an upper surface such as upper surface 408. The lower and upper sides 406 and 408 of the first and second support rails 302 and 304 define the height, h1, of the grip support 118. In one embodiment, the grip support height h1 can be in a range from about 10 mm to about 4 mm. In another embodiment, the grip support height h1 can be about 6 mm. When the grip member 120 is disengaged from the tape frame assembly 106, the grip member 120 is situated between the lower and upper sides 406 and 408 of the first and second support rails 302 and 304. In another embodiment, however, any portion of the grip member 120 can be situated below the lower side and/or above the upper side 408 of at least one of the first and second support rails 302 and 304 when the grip member 120 is disengaged from the tape frame assembly 106.

Referring to FIG. 5, the grip member 120 may include a gripper 502 arranged at the second end 306b. The gripper 502 can have one or more engagement surfaces 502a configured to engage (e.g., physically contact) the frame 108 of the tape frame assembly 106 when the grip mechanism 120 is actuated by the grip actuator 122. In one embodiment, the gripper 502 can include an optional lip portion 504 that helps to define a gripping space 506 within which a portion of the frame 108 can be received.

Figure 6:
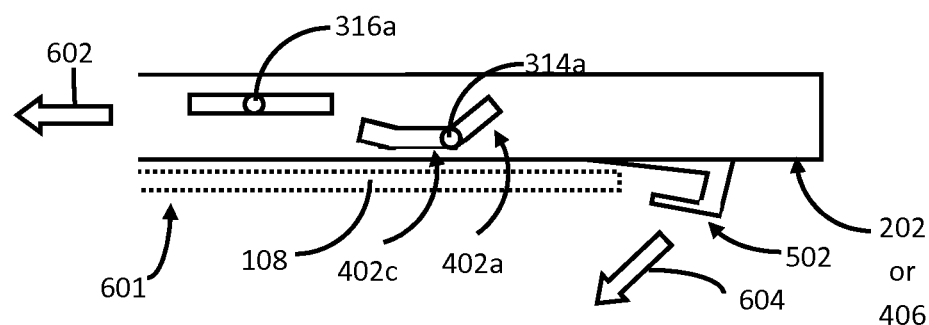
FIGS. 6 and 7 are side plan views schematically illustrating one embodiment of a method of engaging a tape frame assembly using the grip mechanism exemplarily described with respect to FIGS. 3 to 5.
Figure 7:
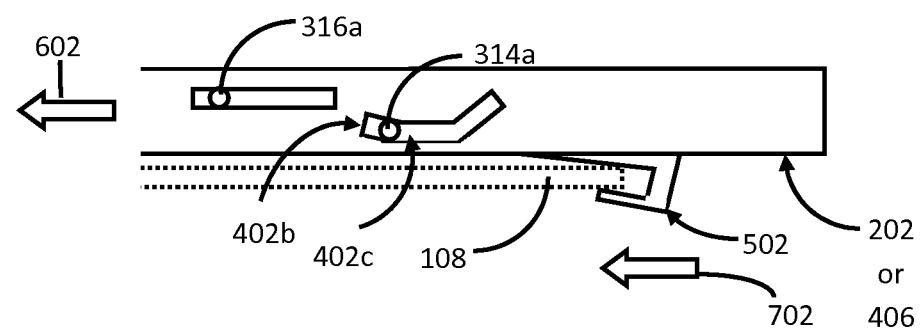

FIGS. 6 and 7 are side plan views schematically illustrating one embodiment of a method of engaging a tape frame assembly using the grip mechanism exemplarily described with respect to FIGS. 3 to 5.

The grip member 120 can be actuated to engage the frame 108 of the tape frame assembly 106 that is disposed within a retaining region 601 adjacent to the end effector 100. In one embodiment, the frame 108 can be engaged by operating the grip actuator 122 to move the linkage arm 308 along the direction indicated by arrow 602 as shown in FIG. 6. Upon moving the linkage arm 308, the grip member 120 is also moved along the direction indicated by arrow 602. As the grip member 120 moves, the first portion 402a of each first slot 402 guides the movement of a corresponding first pin 314 toward the third portion 402c of the first slot 402 (e.g., along the direction indicated by arrow 604). Likewise, each second slot 404 guides the movement of a corresponding second pin 316 (e.g., along the direction indicated by arrow 602). Based on the guided motion of the first and second pins 314 and 316, the grip member 120 is translated and rotated relative to the grip support 118 such that the gripper 502 is moved along a first engagement path (e.g., extending away from the lower side 202 toward the frame 108) to be situated below the lower side 202 of the effector body 112 (or below the lower side of one or both of the first and second support rails 302 and 304) and spaced apart from the frame 108.

Referring to FIG. 7, upon further moving the linkage arm 308 and the grip member 120 along the direction indicated by arrow 602, the third portion 402c of each first slot 402 guides the movement of a corresponding first pin 314 toward the second portion 402b of the first slot 402 (e.g., along the direction indicated by arrow 702). Likewise, each second slot 404 continues to guide the movement of a corresponding second pin 316 (e.g., along the direction indicated by arrow 602). In the illustrated embodiment, arrows 702 and 602 indicate the same direction. It will nevertheless be appreciated that different directions can be indicated by arrows 702 and 602. Based on the guided motion of the first and second pins 314 and 316 as illustrated, the grip member 120 is translated relative to the grip support 118 such that the gripper 502 continues along the first engagement path to a first engagement position in which the gripper 502 is adjacent to the frame 108. At the first engagement position, the frame 108 is located between the gripper 502 and the guide posts 114. In one embodiment, the grip member 120 can be moved such that one or more of the engagement surfaces 502a contacts the frame 108 when the gripper 502 is at the first engagement position. In another embodiment, the grip member 120 can be moved such that an engagement surface 502a of the gripper 502 presses and holds the frame 108 against the guide posts 114 when the gripper 502 is at the first engagement position.

Figure 8:
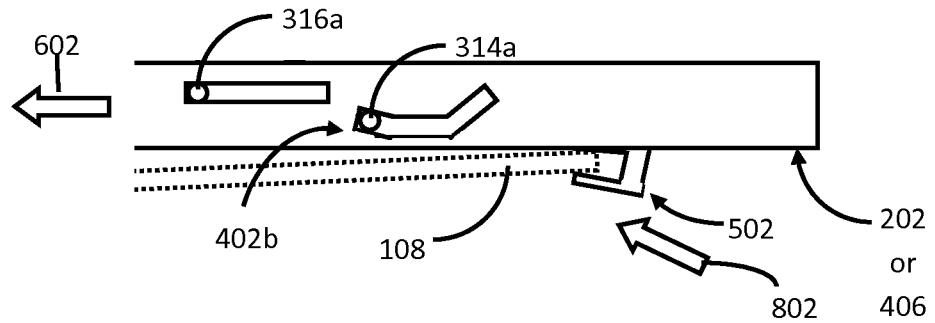
FIG. 8 is a side plan view schematically illustrating another embodiment of a method of engaging a tape frame assembly using the grip mechanism exemplarily described with respect to FIGS. 3 to 5.

FIG. 8 is a side plan view schematically illustrating another embodiment of a method of engaging a tape frame assembly using the grip mechanism exemplarily described with respect to FIGS. 3 to 5.

Referring to FIG. 8, instead of disengaging the frame 108 from the first engagement position shown in FIG. 7, the linkage arm 308 and the grip member 120 may be further moved along the direction indicated by arrow 602, such that the second portion 402b of each first slot 402 guides the movement of a corresponding first pin 314 (e.g., along the direction indicated by arrow 802). Likewise, each second slot 404 can continue to guide the movement of a corresponding second pin 316 along the direction indicated by arrow 602. Based on the guided motion of the first and second pins 314 and 316 as illustrated, the grip member 120 is translated and rotated relative to the grip support 118 such that the gripper 502 is moved along a second engagement path (e.g., extending away from the first engagement position and toward the lower side 202) to a second engagement position in which the gripper 502 is adjacent to the frame 108 and an edge (e.g., a first edge) or other peripheral portion (e.g., a first peripheral portion) of the frame 108 can be moved toward or pressed against the lower side 202 of the effector body 112 by the gripper 502. If the guide posts 114 are provided as described above with respect to FIG. 2A, another edge (e.g., a second edge) or another peripheral portion (e.g., a second peripheral portion) of the frame 108 can be reliably spaced apart from the lower side 202 of the effector body 112. As a result, the tape frame assembly 106 can be reliably and repeatedly tilted relative to the lower side 202 of the effector body 112 when the gripper 502 is disposed at the second engagement position. However, if the guide posts 114 are provided as described above with respect to FIG. 2B, the second edge or second peripheral portion of the frame 108 can be brought into close proximity with or contact the lower side 202 of the effector body 112.

As described above, the gripper 502 is movable to an engagement position (e.g., the first engagement position shown in FIG. 7 or the second engagement position shown in FIG. 8) based on guided movement of the first and second ends 306a and 306b of the grip member 120. Further in light of the discussion above, it will be appreciated that each of the first and second engagement positions are situated relative to the effector body 112 and the guide posts 114 such that the frame 108 and, possibly the substrate 104, is located and held between the gripper 502 and the effector body 112 (and/or the guide posts 114). When the frame 108 is held as described above when the gripper is at the first or second engagement positions as exemplarily shown in FIG. 7 or 8, the grip member 120 is engaged with the tape frame assembly 106. Consequently, the substrate (not shown) that is retained on the tape frame assembly 106 can be handled by the end effector 100. To disengage the grip member 120 from the frame 108, the grip actuator 122 can be operated to move the linkage arm 308 along a direction opposite to that indicated by arrow 602 such that the gripper 502 is ultimately moved to the position as shown in FIG. 6. If desired, the grip actuator 122 can be further operated to move the linkage arm 308 along a direction opposite to that indicated by arrow 602 such that the gripper 502 is moved to the position as shown in FIG. 5. When the grip member 120 disengages the frame 108 of the tape frame assembly 106, the substrate (not shown) can be removed from the end effector 100.

Figure 9:
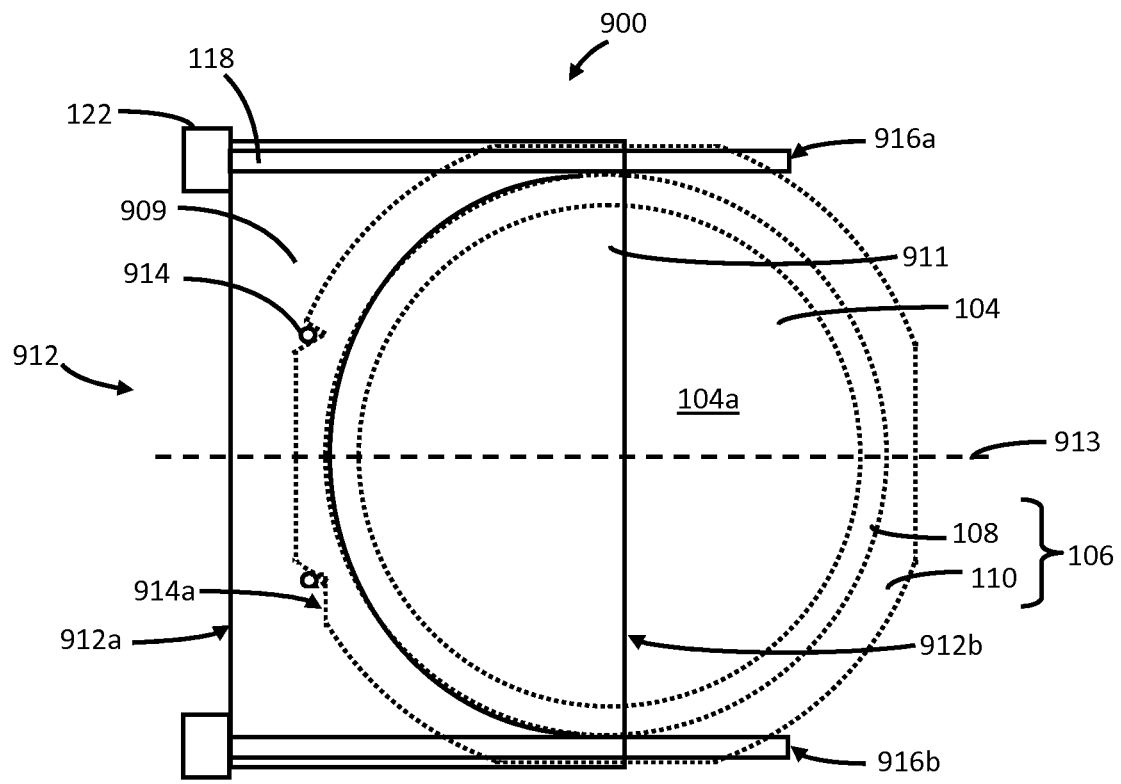
FIGS. 9 and 10 are top and side plan views, respectively, schematically illustrating an end effector having a plurality of grip mechanisms, according to one embodiment.
Figure 10:
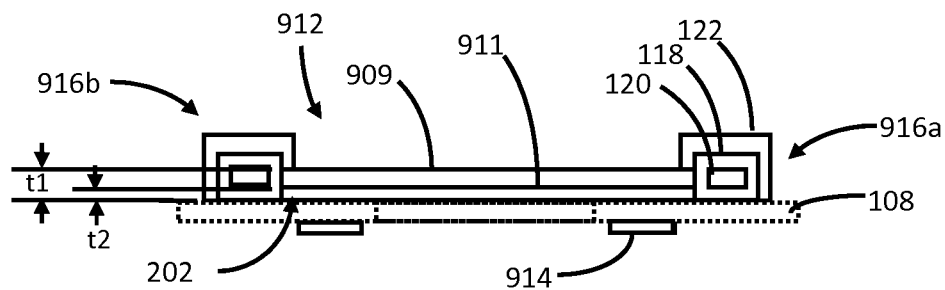

FIGS. 9 and 10 are top and side plan views, respectively, schematically illustrating an end effector having a plurality of grip mechanisms, according to one embodiment.

Referring to FIGS. 9 and 10, an end effector, such as end effector 900, can be configured to handle (e.g., hold, release, move, etc.) a substrate 104 that is supported by a tape frame assembly such as tape frame assembly 106. The substrate 104 and tape frame assembly 106 shown in FIGS. 9 and 10 may be the same as or different from the substrate 104 and tape frame assembly 106 described above with respect to FIGS. 1 and 2. In view of the discussion above, however, it will be appreciated, that the end effector 900 can also be configured to directly handle the substrate 104 (e.g., in a state in which the substrate 104 is not supported by the tape frame assembly). The end effector 900 may include an effector body 912, one or more guide posts 914, and a plurality of grip mechanisms such as grip mechanisms 916a and 916b (generically referred to herein as grip mechanisms 916).

Generally, the effector body 912 extends along one of the major surfaces of the substrate 104 and includes a proximal end 912a and a distal end 912b spaced apart from the proximal end 912a along an axis 913 (also referred to herein as an "effector body axis") of the effector body 912. Similar to the effector body 112, the effector body 912 can be provided as a cantilevered body in which the proximal end 912a is supported by a robot (not shown) and the distal end 912b is unsupported. In the illustrated embodiment the effector body 912 extends over the upper surface 104a of the substrate 104.

The effector body 912 can include a first effector body portion 909 and a second effector body portion 911. Generally, the upper surface of the second effector body portion 911 is recessed relative to the upper surface of the first effector body portion 909. Accordingly, the first effector body portion 909 of the effector body 912 may have a first thickness t1 and the second effector body portion 911 of the effector body 912 may have a second thickness t2 less than t1. The first thickness t1 (as exemplarily illustrated) can be less than the grip support height h1, or can be equal to or greater than the grip support height h1. In one embodiment, the first thickness t1 can be in a range from about 10 mm to about 4 mm. In another embodiment, the first thickness t1 can be about 6 mm. In one embodiment, the second thickness t2 can be in a range from about 5 mm to about 1 mm. In another embodiment, the second thickness t2 can be about 2 mm.

Each guide post 914 can be configured to engage a portion of the frame 108 (e.g., an alignment notch 914a of the frame 108) to help ensure that the tape frame assembly 106 is properly aligned relative to the end effector 100 during handling of the substrate 104. The guide posts 914 may be the same as or different from the guide posts 114 described above.

Each grip mechanism 916 can be provided and operated as exemplarily described above with respect to the grip mechanism 116. As exemplarily illustrated, the grip support 118 of each grip mechanism 916 extends along the effector body axis 113, but is offset from the effector body axis. In other embodiments, however, the grip support 118 may extend along a direction different from the effector body axis 913. As exemplarily illustrated, the grip support 118 of each grip mechanism 916 extends along, but is offset from, the diameter or maximum width of the substrate 104 and the tape frame assembly 106. In other embodiments, however, the grip support 118 of each one or more grip mechanisms 916 may extend along a direction different from the diameter or maximum width of the substrate 104 and/or the tape frame assembly 106. Although not shown, the grip member 120 of each grip mechanism 916 may include an alignment feature configured to engage the frame 108 in such a manner as to ensure that the tape frame assembly 106 is properly aligned with respect to the end effector 900 during handling of the substrate 104.

Figure 11:
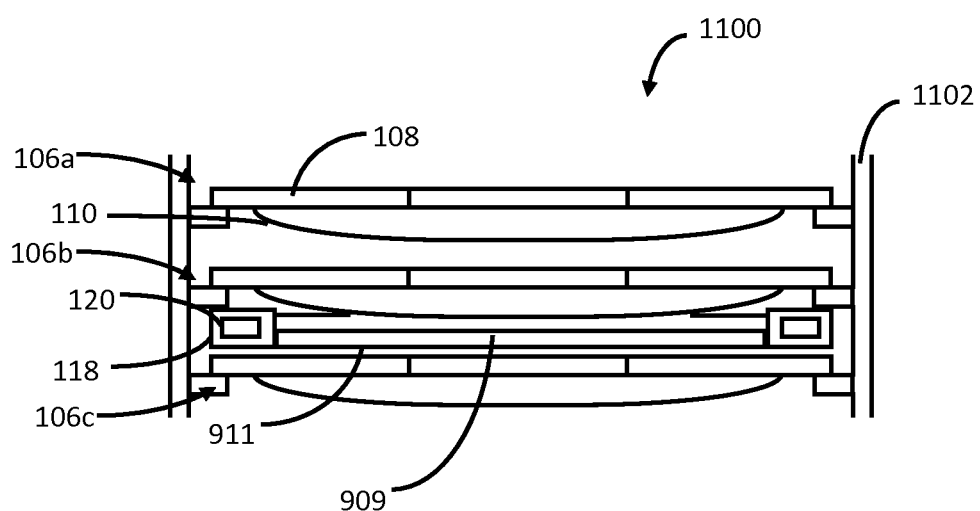
FIG. 11 is a side plan view schematically illustrating the end effector shown FIGS. 9 and 10 inserted into a substrate cassette.

FIG. 11 is a side plan view illustrating the end effector shown FIGS. 9 and 10 inserted into a substrate cassette.

Referring to FIG. 11, the end effector 900 can be inserted into a cassette 1100 having a shelving system 1102 configured to store a plurality of tape frame assemblies 106 (e.g., first tape frame assembly 106a, second tape frame assembly 106b and third tape frame assembly 106c). Although FIG. 11 illustrates only three tape frame assemblies, it will be appreciated that the shelving system 1102 may be configured to support any number of tape frame assemblies 106. To increase the number of tape frame assemblies 106 that can be stored within the cassette 1100, the shelving system 1102 configured to store the plurality of tape frame assemblies 106 at a relatively small pitch (e.g., 10 mm). Thus, the distance between frames 108 of adjacent tape frame assemblies 106 can be about 10 mm or less. As exemplarily illustrated, however, the support film 110 of each tape frame assembly 106 can sag up to about 3 mm due to the weight of the substrate (not shown) that it supports. Thus, the distance between a support film 110 of one tape frame assembly 106 (e.g., the second tape frame assembly 106b) and a frame 108 of an adjacent tape frame assembly 106 (e.g., the third tape frame assembly 106c) can be about 7 mm or less.

To remove a substrate retained on a tape frame assembly 106 stored within the cassette 1100, a robot (not shown) can be operated to insert an end effector (e.g., end effector 900) into the cassette 1100 (e.g., between the second and third tape frame assemblies 106b and 106c). Upon insertion of the end effector 900, the effector body 912 is arranged over the frame 108 of the third tape frame assembly 106c. As exemplarily illustrated, the second effector body portion 911 is arranged below the support film 110 of the second tape frame assembly 106b that is experiencing maximum sag whereas the first effector body portion 909 is arranged behind the portion of the support film 110 of the second tape frame assembly 106b that is experiencing maximum sag. Next, the grip member 120 of each of the first and second grip mechanisms 916a 916b is actuated to selectively engage the frame 108 of the third tape frame assembly 106c (e.g., in the manner as exemplarily described above with respect to any of FIGS. 5 to 8). When the frame 108 of the third tape frame assembly 106c is engaged, the robot can be operated to remove the end effector 900 from the cassette 1100. The substrate retained by the third tape frame assembly 106c can then be handled with the end effector 900 in any manner desired. It will be appreciated that a substrate retained on a tape frame assembly 106 can be inserted into the cassette 1100 by performing the procedure outlined above in reverse.

Having described various apparatuses and methods above, it will be appreciated that embodiments of the present invention may be implemented and practiced in many different forms. For example, an end effector may include an end effector body, a grip member movable relative to the effector body, and a guide post coupled to the effector body. The grip member and the guide post are configured to engage different portions of an object such as a substrate, a tape frame assembly supporting a substrate, or the like. The grip member and the guide post can be configured such a first portion of the object engaged by the grip member is closer to the effector body than a second portion of the object engaged by the guide post.

The foregoing is illustrative of embodiments of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific example embodiments of the invention disclosed, and that modifications to the disclosed example embodiments, as well as other embodiments, are intended to be included within the scope of the appended claims. The invention is defined by the following claims, with equivalents of the claims to be included therein.

What is claimed is:

1. A grip mechanism for an end effector, the end effector including an effector body having a first end, a second end opposite the first end and a proximal side extending between the first and second ends, the end effector operative to handle an object disposed within a retaining region and having a first surface facing toward the proximal side and a second surface opposite the first surface, the grip mechanism comprising:
   a grip member configured to be coupled to the effector body and including a gripper, wherein the grip member is movable in a first direction away from the first end toward the second end and wherein a first portion of the grip member is moveable relative to the effector body along a first travel path based on movement of the grip member in the first direction; and
   a grip guide operatively coupled to the grip member, wherein the grip guide is configured to guide a movement of a second portion of the grip member along a second travel path based on movement of the grip member in the first direction,
   wherein the grip member and grip guide are configured such that the gripper is movable to a first engagement position along a first engagement path based upon movement of the first and second portions along the first and second travel paths, the first engagement path extending away from the proximal side of the effector body and toward the retaining region, and
   wherein, at the first engagement position, the gripper is configured to contact the second surface of the object disposed within the retaining region.

2. The grip mechanism of claim 1, wherein first portion of the grip member is immovable relative to the second portion of the grip member.

3. The grip mechanism of claim 1, wherein the grip member and grip guide are configured such that the gripper is translatable relative to the effector body.

4. The grip mechanism of claim 3, wherein the grip member and grip guide are configured such that the gripper is rotatable relative to the effector body.

5. The grip mechanism of claim 1, wherein the grip member and grip guide are configured such that the gripper is rotatable relative to the effector body.

6. The grip mechanism of claim 5, wherein the gripper is rotatable relative to the effector body about an axis of rotation arranged at an angle of greater than 0 degrees and less than 180 degrees relative to the first direction in which the grip member is movable.

7. The grip mechanism of claim 1, wherein at least a portion of the first travel path is not parallel to at least a portion of the second travel path.

8. The grip mechanism of claim 1, wherein at least a portion of the first travel path is parallel to at least a portion of the second travel path.

9. The grip mechanism of claim 1, wherein at least one of the first travel path and the second travel path includes a linear portion.

10. The grip mechanism of claim 9, wherein the second travel path includes at least two linear portions extending along different directions.

11. The grip mechanism of claim 1, wherein at least one of the first travel path and the second travel path includes a curved portion.

12. The grip mechanism of claim 1, wherein the grip member and grip guide are configured such that the gripper is movable to a second engagement position along a second engagement path based upon movement of the first and second portions along the first and second travel paths, the second engagement path extending away from the first engagement position and toward the proximal side of the effector body.

13. The grip, mechanism of claim 1, wherein:
   the grip member is movable in a second direction away from the second end toward the first end, and the gripper is configured to disengage an engaged object disposed within the retaining region based upon movement of the grip member in the second direction.

14. A grip mechanism for an end effector, the end effector including an effector body having a first end, a second end opposite the first end and a proximal side extending between the first and second ends, the end effector operative to handle an object disposed within a retaining region adjacent to the proximal side, the grip mechanism comprising:
a grip member configured to the effector body and including a gripper, wherein the grip member is movable in a first direction away from the first end toward the second end and wherein a first portion of the grip member is moveable relative to the effector body along a first travel path based on movement of the grip member in the first direction; and
a grip guide operatively coupled to the grip member, wherein the grip guide is configured to guide a movement of a second portion of the grip member along a second travel path based on movement of the grip member in the first direction,
wherein the grip member and grip guide are configured such that the gripper is movable to a first engagement position along a first engagement path based upon movement of the first and second portions along the first and second travel paths, the first engagement path extending away from the proximal side of the effector body and toward the retaining region, and
wherein, at the first engagement position, the gripper is configured to engage an object disposed within the retaining region, and
wherein the grip guide comprises:
a first support rail configured to be coupled to the effector body;
a first slot formed in the first support rail; and
a first pin coupled to the second portion of the grip member and slideably received within the first slot.

15. The grip mechanism of claim 14, wherein the grip guide comprises:
a second support rail spaced apart from the first support rail; and
a third slot formed in the second support rail,
wherein the guide member is disposed between the second support rail and the first support rail and wherein the first pin is slideably received within the third slot.

16. The grip mechanism of claim 14, wherein the grip guide further comprises:
a second slot formed in the first support rail; and
a second pin coupled to the first portion of the grip member and slideably received within the second slot.

17. An end effector operative to handle an object having a first major surface and a second major surface opposite the first major surface when the object is disposed within a retaining region adjacent to the end effector, the end effector comprising:
an effector body having a first end, a second end opposite the first end and a proximal side extending between the first and second ends and adjacent to the retaining region; and
a grip mechanism including:
a grip member coupled to the effector body and including a gripper defining a gripping space therein, wherein the grip member is movable in a first direction away from the first end toward the second end and wherein a first portion of the grip member is moveable relative to the effector body along a first travel path based on movement of the grip member in the first direction, and wherein the gripping space is configured to receive a portion of the object; and
a grip guide operatively coupled to the grip member, wherein the grip guide is configured to guide a movement of a second portion of the grip member along a second travel path based on movement of the grip member in the first direction,
wherein the grip member and grip guide are configured such that the gripper is movable to a first engagement position along a first engagement path based upon movement of the first and second portions along the first and second travel paths, the engagement path extending away from the proximal side of the effector body and toward the retaining region, and
wherein a portion of the first and second major surfaces of the object are insertable into the gripping space when the gripper is at the first engagement position.

18. The end effector of claim 17, further comprising a plurality of grip mechanisms.

19. The end effector of claim 17, wherein the grip member and grip guide are configured such that the gripper is movable to a second engagement position along a second engagement path based upon movement of the first and second portions along the first and second travel paths, the second engagement path extending away from the first engagement position and toward the proximal side of the effector body.

20. The end effector of claim 17, wherein the grip member and grip guide are configured such that the gripper is translatable relative to the effector body, rotatable relative to the effector body or a combination thereof.

21. A method of handling a tape frame assembly comprising a frame and a support film spanning the frame, the support film configured to support a substrate, the method comprising:
arranging an end effector adjacent to the tape frame assembly, the end effector including:
an effector body having a first end, a second end opposite the first end and a proximal side extending between the first and second ends; and
a grip member coupled to the effector body, the grip member having a gripper;
moving the grip member in a first direction away from the first end and toward the second end, wherein moving the grip member includes:
moving the gripper to a first engagement position along a first engagement path, the engagement path extending away from the proximal side of the effector body and toward the retaining region;
retaining the tape frame assembly within the retaining region when the gripper is at the first engagement position; and wherein arranging the end effector adjacent to the tape frame assembly comprises arranging the end effector over the tape frame assembly.

22. The method of claim 21, wherein moving the grip member in the first direction further includes:
moving the gripper to a second engagement position along a second engagement path, the second engagement path extending away from the first engagement position and toward the proximal side of the effector body.

23. The method of claim 21, further comprising releasing the tape frame assembly from the retaining region.

* * * * *